United States Patent
Frantz et al.

(10) Patent No.: US 10,128,030 B2
(45) Date of Patent: Nov. 13, 2018

(54) SUPERCONDUCTING MAGNET COIL SYSTEM

(71) Applicant: Bruker BioSpin GmbH, Rheinstetten (DE)

(72) Inventors: Wolfgang Frantz, Karlsruhe (DE); Patrick Wikus, Nuerensdorf (CH)

(73) Assignee: BRUKER BIOSPIN GMBH, Rheinstetten (DE)

( * ) Notice: Subject to any disclaimer, the term of this patent is extended or adjusted under 35 U.S.C. 154(b) by 177 days.

(21) Appl. No.: 15/392,395

(22) Filed: Dec. 28, 2016

(65) Prior Publication Data

US 2017/0186520 A1    Jun. 29, 2017

(30) Foreign Application Priority Data

Dec. 28, 2015    (DE) .......................... 10 2015 122 879

(51) Int. Cl.
*H01F 6/06* (2006.01)
*G01R 33/28* (2006.01)
(Continued)

(52) U.S. Cl.
CPC ........... *H01F 6/06* (2013.01); *G01R 33/3815* (2013.01); *H01F 6/02* (2013.01); *G01R 33/288* (2013.01)

(58) Field of Classification Search
CPC .............. H01F 6/06; H01F 6/02; G01R 33/28
See application file for complete search history.

(56) References Cited

U.S. PATENT DOCUMENTS 6,147,844 A * 11/2000 Huang ............... G01R 33/3815
361/141
6,307,370 B1 * 10/2001 Schauwecker ....... G01R 33/421
324/309
(Continued)

FOREIGN PATENT DOCUMENTS

DE    102009029379 B4    12/2012
EP        2026083 A2    2/2009
(Continued)

OTHER PUBLICATIONS

Markiewicz, W. et al., "Design of a superconducting 32 T magnet with REBCO high field coils", IEEE Transactions on Applied Superconductivity, vol. 22, No. 3, Jun. 2012.
(Continued)

*Primary Examiner* — G. M. A Hyder
(74) *Attorney, Agent, or Firm* — Edell, Shapiro & Finnan, LLC

(57) ABSTRACT

A superconducting magnet coil system with high resistance to quench events includes a first coil portion (1) with a first superconducting material and a second coil portion (2) with a second superconducting material. The first superconducting material has a higher critical temperature than the second superconducting material. The first and the second coil portions are bridged by a common quench protection element (6) and together with the quench protection element form a first loop. The magnet coil system also includes a third coil portion (3) which is part of a second electrical loop with a second quench protection element (8, 8', 8") as well as a heating element (9) which is supplied with a heating voltage in response to a quench of the third coil portion. Among the series connected coil portions (1, 2) only the second coil portion is in thermal contact with the first heating element (9).

17 Claims, 4 Drawing Sheets

(51) Int. Cl.
*G01R 33/3815* (2006.01)
*H01F 6/02* (2006.01)

(56) References Cited

U.S. PATENT DOCUMENTS

| | | | |
|---|---|---|---|
| 7,649,720 B2 | 1/2010 | Markiewicz | |
| 8,467,841 B2 | 6/2013 | Frantz et al. | |
| 2006/0066429 A1* | 3/2006 | Kasten | G01R 33/3815 335/296 |
| 2006/0158795 A1* | 7/2006 | Tsuchiya | H02H 7/001 361/19 |
| 2006/0291112 A1 | 12/2006 | Markiewicz | |
| 2009/0045895 A1* | 2/2009 | Kasten | G01R 33/3815 335/216 |
| 2009/0082209 A1* | 3/2009 | Bunyk | B82Y 10/00 505/190 |
| 2011/0065584 A1* | 3/2011 | Frantz | G01R 33/3815 505/162 |
| 2012/0014030 A1* | 1/2012 | Ichiki | H01F 6/02 361/141 |
| 2014/0066312 A1* | 3/2014 | Kasten | G01R 33/3815 505/162 |

FOREIGN PATENT DOCUMENTS

| | | |
|---|---|---|
| GB | 2473920 A | 3/2011 |
| JP | H01261807 A | 10/1989 |
| JP | H11102807 A | 4/1999 |
| JP | 2005353777 A | 12/2005 |
| JP | 2010147370 A | 7/2010 |
| JP | 2011155096 A | 8/2011 |
| JP | 2015043358 A | 3/2015 |

OTHER PUBLICATIONS

Wilson, "Superconducting magnets", Chapter 9.8, pp. 226ff, Oxford University Press, 1983.

* cited by examiner

SUPERCONDUCTING MAGNET COIL SYSTEM

CROSS REFERENCE TO RELATED APPLICATIONS

This application claims foreign priority under 35 U.S.C. § 119(a)-(d) to German Application No. 10 2015 122 879.3 filed on Dec. 28, 2015, the entire contents of which are hereby incorporated by reference.

FIELD

The present disclosure relates to superconducting magnet coil systems, such as Nuclear Magnetic Resonance magnet coil systems.

BACKGROUND

In conventional superconducting Nuclear Magnetic Resonance (NMR) magnet coil systems NbTi and $Nb_3Sn$ wires are usually used, which limits the field strength of the NMR magnet coil system to approximately 23.5 T. In order to achieve higher field strengths or to provide a more compact magnet coil system, alternative conductor materials may be used. In such devices, "high temperature superconductor" (HTS) strip conductors (for example YBCO strips) are predominantly used. Such magnet coil systems may not be manufactured completely from HTS materials; for reasons of cost it may be advantageous to use HTS materials for the innermost portions and to manufacture the background magnet using conventional "low-temperature superconductor" (LTS) technology (e.g., materials such as NbTi or $Nb_3Sn$).

However, HTS materials may impose special requirements on the quench protection of a superconducting magnet. "Quench" refers to the spontaneous transition of the magnet coil from the superconducting state into the normal-conducting state due to overloading of the current-carrying superconductor. The quench usually starts locally and spontaneously and then propagates in the magnet over several seconds. A quench may be associated with high electrical voltages, currents and forces in the superconductor, which can in turn destroy the magnet.

In a typical quench protection circuit for NMR magnets individual sections or zones of individual sections are connected in parallel with protective resistors and thus form a loop of a protective network. The different protective network loops are connected in series. In this way it is possible to keep the quench duration and quench voltages low (see Wilson "Superconducting magnets", Chapter 9.8, pages 226ff, 1983, Oxford University Press).

However, typical HTS materials may be disadvantageous in the event of a quench. The high critical temperature of the HTS material (zero field: YBCO approximately 90 K, $Nb_3Sn$ approximately 18 K, NbTi approximately 10 K) leads to a late "co-quenching" when the quench starts in the NbTi or $Nb_3Sn$ part of the background magnet. Depending upon the quench protection method (for example in the event of sub-division into protective network loops) this results in an increase in current or force in the HTS sections. Moreover, the slow quench propagation in the HTS sections leads to local overheating, which may cause a burnout of the conductor. Therefore, in loops in which the superconductor quenches late, increases in current and force may occur, which may overload the superconductor.

German Patent Application DE 10 2009 029 379 discloses a magnet coil system in which each section that quenches late (for example HTS material sections) is protected in a common loop together with a coil part which quenches fast or early. As a result, increases in current are prevented in the sections which otherwise quench late, thereby preventing increases in current (or burnout) in the HTS portions.

It is known from U.S. Pat. No. 7,649,720 B2 to start a quench by additional heating, in order to avoid increases in current. An improved active quench propagation in the HTS conductor is effected by the use of many extensive heaters in the HTS winding. However, a disadvantage of this is that in the event of a quench the HTS section still risks being destroyed. Moreover, the manufacturing costs during winding of these sections with additional heaters are very high and the homogeneity of the magnetic field generated by these sections can be disrupted by the plurality of heaters, and the associated non-roundness of the winding.

SUMMARY

According to example embodiments, provided herein are magnet coil systems with a small overall size, that may achieve high field strengths and that may be resistant to quench events.

Example embodiments of such magnet coil systems are recited in claim 1 and may be achieved through a method such as that recited in claim 16.

Also described herein is a magnet coil system comprising at least one first heating element which is configured to be supplied with a heating voltage for reducing the current in a first loop of the magnetic coil system, such as in the event of a quench of a third main coil portion. Of the series connected main coil portions of the first loop only the second main coil portion is in thermal contact with the first heating element.

Thus the first heating element of the magnet coil system according to the techniques described herein is configured to be supplied with a heating voltage to reduce the current in the first loop, in particular if the third main coil portion quenches.

Because of the higher critical temperature of the first main coil portion, and in the case of a comparable conductor loading $I_{Magnet}/Ic$ (wherein Ic designates the critical current of the superconductor and depends upon the magnetic field at the location of the conductor), a quench propagates in the first main coil portion more slowly than in the second main coil portion, which in the event of a quench can lead to damage to the superconductor of the first main coil portion. Due to the wiring and heating as described herein, in the event of a quench (regardless of where the quench takes place) within the series connection of the first and second main coil portions only the main coil portion which has the lowest critical temperature (that is to say it quenches fastest) is heated. Thus, the second main coil portion is brought to quench prematurely, so that the current is reduced in the first loop before a significant increase in current can occur in the first main coil portion.

In the magnet coil systems according to the techniques described herein, the main coil portion with the higher critical temperature (e.g., the first main coil portion) is not heated, as there is a high probability that it would be destroyed in the event of a quench. Instead, the second main coil portion with the lower critical temperature located in the same loop is heated. Thus, the second main coil portion may discharge quickly together with the first main coil portion, so that a quench in the first main coil portion (preferably made of an HTS material) is avoidable or is less dangerous (even if the HTS section were to quench, no damage occurs if the current falls quickly enough).

The thermal contact between the first heating element and the second main coil portion may be produced by a heat-conducting contact. A heating element according to example embodiments may be embodied as a heater film which is inlaid into a winding pack between two layers of the main coil portion to be heated. For this purpose, a heater winding of very thin copper, manganese and nickel alloy (e.g., a Cu86/Mn12/Ni2 alloy, known in the industry as Manganin™) wires can be laid in a meandering pattern and may be glued, for example, between two thin films made of polyoxydiphenylene-pyromellitimide polymers (e.g., polymers known in the industry as Kapton™).

The first and the second main coil portions are preferably separated spatially (thereby forming different coil formers), so that the second main coil portion can be heated and quenched independently of the first main coil portion. A main coil portion may comprise a main coil section or a part of a main coil section.

The first main coil portion may be the main coil portion which has the highest critical temperature of all the main coil portions of the magnet coil system.

In one particular example embodiment the first superconducting material is an HTS material. HTS materials may be used in magnet coil systems in high field zones in which other superconductors have no or no significant current-carrying capability. However, HTS materials may also be used in the middle field zone, for example in order to produce a compact construction of the magnet coil system. The techniques described herein may be applied to coil systems when an HTS material is used, as a quench propagates very slowly in the HTS material because of the high critical temperature, and as a result the HTS material can be easily damaged (by an increase in current and/or overheating) during a quench. The techniques presented in the example embodiments disclosed herein may prevent such damage to portions of coil systems constructed with HTS materials.

However, even when LTS materials are used as the first superconducting material the techniques described herein may be beneficial if the first material quenches more slowly or later than the second material because of a higher critical temperature (Tc) or a particularly low load (very small value $I_{Magnet}/Ic$). Thus, for example, a common connection of a $Nb_3Sn$ main coil portion as first main coil portion and a NbTi main coil portion as second main coil portion in combination with the heating of the second main coil portion (NbTi) may be more favorable for the $Nb_3Sn$ protection than direct heating of the $Nb_3Sn$ portion.

The second superconducting material may be an LTS material, for example, NbTi or $Nb_3Sn$.

In example embodiments the second quench protection element bridges the third main coil portion. In this case the third main coil portion may comprise an LTS material, such as NbTi or $Nb_3Sn$.

The first main coil portion and the second main coil portion may follow one another radially directly. Thus, the two adjacent main coil portions of the first loop may be simply connected to one another. As an alternative to this a main coil portion of the second or a further electrical loop may be arranged radially between the first and the second main coil portions.

In another example embodiment the second quench protection element bridges a series connection which comprises the third main coil portion and a fourth main coil portion with a conductor made of a superconducting material, wherein the superconducting material of the fourth main coil portion has a higher critical temperature than the superconducting material of the third main coil portion. The third and the fourth main coil portions are connected to one another in series in such a way that in operation current flows through them in the same direction. The first and the fourth main coil portions may comprise the same (first) superconducting material, in particular an HTS material, and the second and third main coil portion may comprise the same (second) superconducting material, in particular an LTS material. Thus, in this example embodiment the HTS material of the magnet coil arrangement is distributed over two loops and within each loop is protected together with a main coil portion made of LTS material. As the HTS layers are distributed over two loops, the inductance for each individual loop and thus the decay time of the current may be reduced, which is of particular interest if HTS sections are used with many layers, as these have a high inductance, which in the event of a quench would ensure a slow reduction of the current in the corresponding loop.

In another example embodiment the magnet coil system comprises at least one second heating element which may be supplied with a heating voltage for reduction of the current in the second loop, such as in the event of a quench of the second main coil portion in the first loop. In such an embodiment, only the third main coil portion of the series-connected main coil portions of the second loop is in thermal contact with the second heating element. Thus, the second heating element is configured to be supplied with a heating voltage if the current in the second loop is to be reduced, in particular if the second main coil portion quenches. Analogous to the connection of the first heating element, the second heating element, which is connected as described within the series connection of third and fourth main coil portion, heats. In the event of a quench, the main coil portion of the second loop that has the lowest critical temperature and thus quenches fastest (e.g., the third main coil portion) is heated by the second heating element. Thus, the third main coil portion is brought to quench prematurely, so that the current is reduced in the second loop before an increase in current can occur in the fourth main coil portion.

The second quench protection element preferably serves as a first heating element. In particular, the second quench protection element may be embodied as a resistor, wherein the heat coming off of the resistor in the event of a quench is used for heating of the second main coil portion. Analogously, the first quench protection element may serve as a second heating element.

In an alternative example embodiment the first heating element is connected in parallel to the second quench protection element. Analogously, the second quench protection element may be connected in parallel to the first heating element.

In the event of a quench the heating element of the main coil portion which is bridged by this heating element or by the quench protection element connected in parallel to the heating element is automatically supplied with voltage.

There may also be a plurality of further main coil portions in each case bridged by a further quench protection element. In this case the further quench protection elements may each serve as a heating element for a main coil portion with a low critical temperature, which is located in the same loop as a main coil portion with a high critical temperature (in particular for the second or third main coil portion), or a heating element may be connected in parallel to at least one of the further quench protection elements, preferably to all further quench protection elements.

During the charging/discharging of the magnet system, (crossed) diodes may be used in order to avoid the introduction of heat into the second main coil portion which is in thermal contact with the first heating element. A current then flows only when a threshold voltage is exceeded, which lies above the voltage drop during the charging/discharging but is very quickly exceeded in the event of a quench One example embodiment of the magnet coil system includes a heating control device with a quench diagnosis element which monitors at least one of the main coil portions, in particular the first main coil portion. In the event of a quench of the monitored main coil portion the heating control device supplies an additional heating element with voltage, wherein of the main coil portions of the first loop which are connected in series only the second main coil portion is in thermal contact with the additional heating element. For such an "active quench management" a first main coil portion made of an HTS material (HTS section) is of particular interest: In the event of a quench in the first main coil portion, the quench diagnosis element preferably detects a voltage drop over the first quench protection element. This signal in turn may be used to activate the heating element in the second main coil portion and thus to speed up the quench in the second main coil portion and to quickly reduce the load on the first main coil portion. Thus, if the first main coil portion is designed as an HTS main coil portion and begins to quench (even slowly), the voltage rise associated therewith is used as a trigger for the quench diagnosis element, which may then initiate a fast quench in another main coil portion (which is connected together with the HTS main coil portion).

If a plurality of HTS main coil portions are present in different loops, a plurality of diagnostic taps may be provided (one for every loop with HTS material).

It is also possible to monitor another main coil portion with a quench diagnosis element, which in the event of a quench supplies voltage to a heating element which is in thermal contact with the second main coil portion. It is then already possible to detect a quench, so long as the voltage is still small enough that it is not sufficient for activating a heating element designed as a quench protection element, and it is possible to react correspondingly quickly.

If a plurality of HTS main coil portions are provided, a second heating control device may be provided, comprising a second quench diagnosis element which monitors one of the main coil portions, wherein the heating control device supplies the first or the second heating element with voltage in the event of a quench of the monitored main coil portion.

The main coil portions may be radially nested in one another, in particular as concentrically arranged solenoid coil portions.

The first main coil portion with the higher critical temperature may be arranged radially further inside than the second main coil portion. In some example embodiments the first main coil portion is the innermost main coil portion of the magnet coil arrangement.

In example embodiments, the heating element is arranged inside the second main coil portion at the location at which the superconductor has the highest Ic loading during operation of the magnet coil system. Thus, the heating element is arranged where the ratio $I_o/I_c$ of magnet current $I_0$ to critical current Ic is greatest inside the second main coil portion. This will generally be the position for which the critical current is smallest. The critical current in turn is dependent upon the magnetic field at the location of the conductor: the higher the magnetic field, the smaller the critical current is. However, the magnitude of the critical current is also dependent upon the proportion of the superconductor material in the conductor. In principle a conductor with a small proportion of superconductor material in a low field may have a higher $I_C$ loading than a conductor with a very large amount of superconductor material in a high field. Therefore, the ratio $I_o/I_c$ is crucial for the particular superconductor. However, the conductor with the highest capacity is also usually located in the highest magnetic field for the respective superconducting material.

The magnet coil system according to example embodiments may be a superconducting NMR magnet coil system. In order to be able to achieve the highest fields, HTS materials may be used for the innermost main coil portion, which may be protected against overheating or force overloading by the protective circuitry in the event of a quench.

Example embodiments also relate to methods of operating a superconducting magnet coil system, characterized in that, in the event of a quench of a main coil portion of the second electrical loop, the second main coil portion is heated by the first heating element.

Further example embodiments and advantages are disclosed by the description and the drawings. Likewise, the features referred to above and the further features set out here may each be used according to the techniques taught herein alone or several may be used in any combination. The embodiments shown and described should not be understood as a definitive listing, but rather as examples for clarity of explanation.

DETAILED DESCRIPTION

Figure 1A:
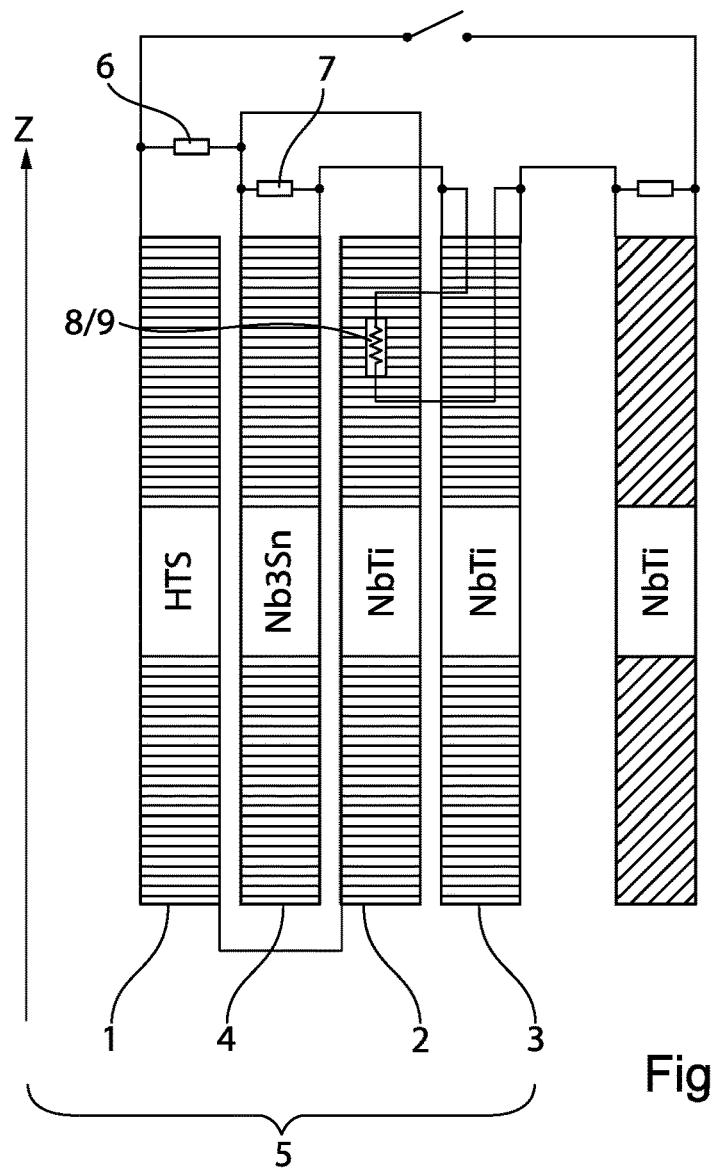
FIG. 1A shows a schematic vertical section of an example embodiment of a magnet coil system in which a quench protection element of the second loop serves as a heating element.
Figure 1B:
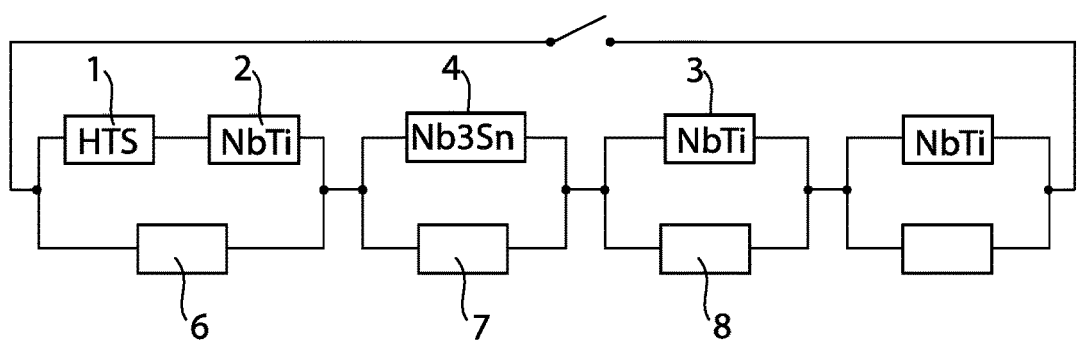
FIG. 1B shows a circuit diagram of the arrangement according to FIG. 1A.
Figure 2:
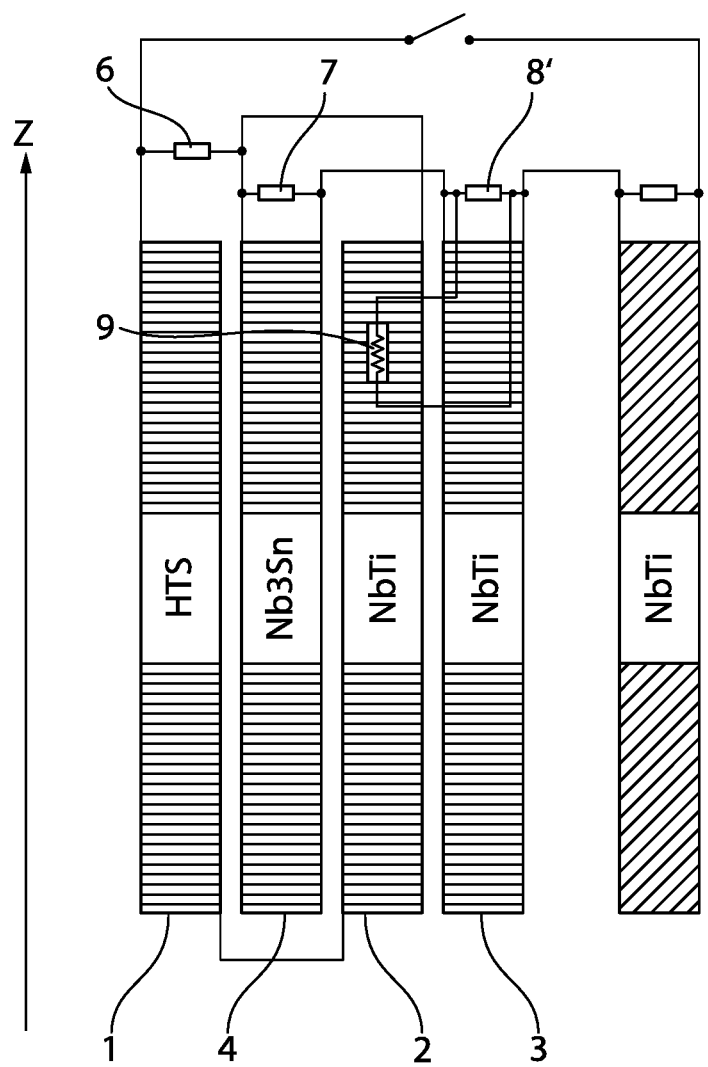
FIG. 2 shows a schematic vertical section of a second example embodiment of a magnet coil system in which the heating element is connected in parallel to the quench protection element of the second loop.

FIGS. 1A, 1B and 2 show two example embodiments of a magnet coil arrangement, with a first main coil portion 1 made of a first superconducting material (e.g., an HTS main coil portion), a second main coil portion 2 made of a second superconducting material (e.g., an inner NbTi main coil portion), a third main coil portion 3 and a further main coil portion 4, wherein the further main coil portion 4 comprises $Nb_3Sn$ as its superconducting material and is arranged radially between the first main coil portion 1 and the second main coil portion 2. The first main coil portion 1 and the second main coil portion 2 are connected to one another in series in such a way that they directly follow one another in the serial electrical connection. The third main coil portion 3 comprises NbTi as its superconducting material and forms the radially outermost main coil portion of a main coil 5. The first main coil portion 1 and the second main coil portion 2 are protected by a common (first) quench protection element 6 and form a protective network loop (first electrical loop) with this element. Thus, the HTS main coil portion 1 and the inner NbTi main coil portion 2 are connected to one another. The third main coil portion 3 is protected by a second quench protection element 8 and the further main coil portion 4 is protected by a further quench protection element 7, wherein the third main coil portion 3 with the second quench protection element 8 form a second protective network loop and the further main coil portion 4 with the further quench protection element 7 form a further protective network loop.

If a magnet quench starts in the inner NbTi main coil portion 2, the magnet current in the first protective network loop, which comprises the quenching NbTi main coil portion 2 and the HTS main coil portion 1, immediately drops. If the outer NbTi main coil portion 3 (or also the $Nb_3Sn$ main coil portion 4) quenches, then the inner NbTi main coil portion 2 also quenches a short time later, as it is typically operated at its Ic capacity limit. However, this time delay—although it is short—may lead to an increase in current in the HTS main coil portion 1 and destruction of the HTS material of the first main coil portion 1. In order to prevent this, a heating element 9 is provided which heats exclusively the inner NbTi main coil portion 2, if a quench takes place in another main coil portion (in this case in the outer NbTi main coil portion 3), so that the quench in the inner NbTi main coil portion 2 is speeded up. In this way, an increase in current and a heat input and thus a quench risk in the HTS material are avoided.

Thus the HTS main coil portion 1 is protected together with the NbTi main coil portion 2, wherein in the event of a magnet quench the quench propagation in the second main coil portion 2 is speeded up by heating of the second main coil portion 2.

In the embodiment illustrated in FIG. 1 the (second) quench protection element 8 functions as first heating element 9 of the outer NbTi main coil portion 3, so that in the event of a quench, heat is introduced directly by the quench protection element 8 into the second main coil portion 2. The corresponding circuit diagram is shown in FIG. 1B. However, it is also possible to provide a quench protection element 8' for the NbTi main coil portion 3, wherein the quench protection element does not serve as a heating element but is electrically connected in parallel to the heating element 9, as illustrated in FIG. 2. In the event of a quench, the voltage drop is the same on the quench protection element 8' and on the heating element 9, therefore in this embodiment heating of the second main coil portion 2 takes place immediately in the event of a quench.

Analogously, the further quench protection element 7 may also serve as heating element or may be connected in parallel to a heating element (not shown), in order to speed up the quench in the inner NbTi main coil portion 2 in the event of a quench in the further main coil portion 4.

Thus, the magnet coil arrangement speeds up the current reduction in the HTS main coil portion 1 in the event of a quench of a main coil portion 3 of the second loop by heating/quenching of the NbTi main coil portion 2 protected together with the HTS main coil portion 1 in the first loop, as the current in the HTS main coil portion 1 may then decrease quickly, regardless of the quench propagation rate in the HTS main coil portion 1 itself.

Figure 3:
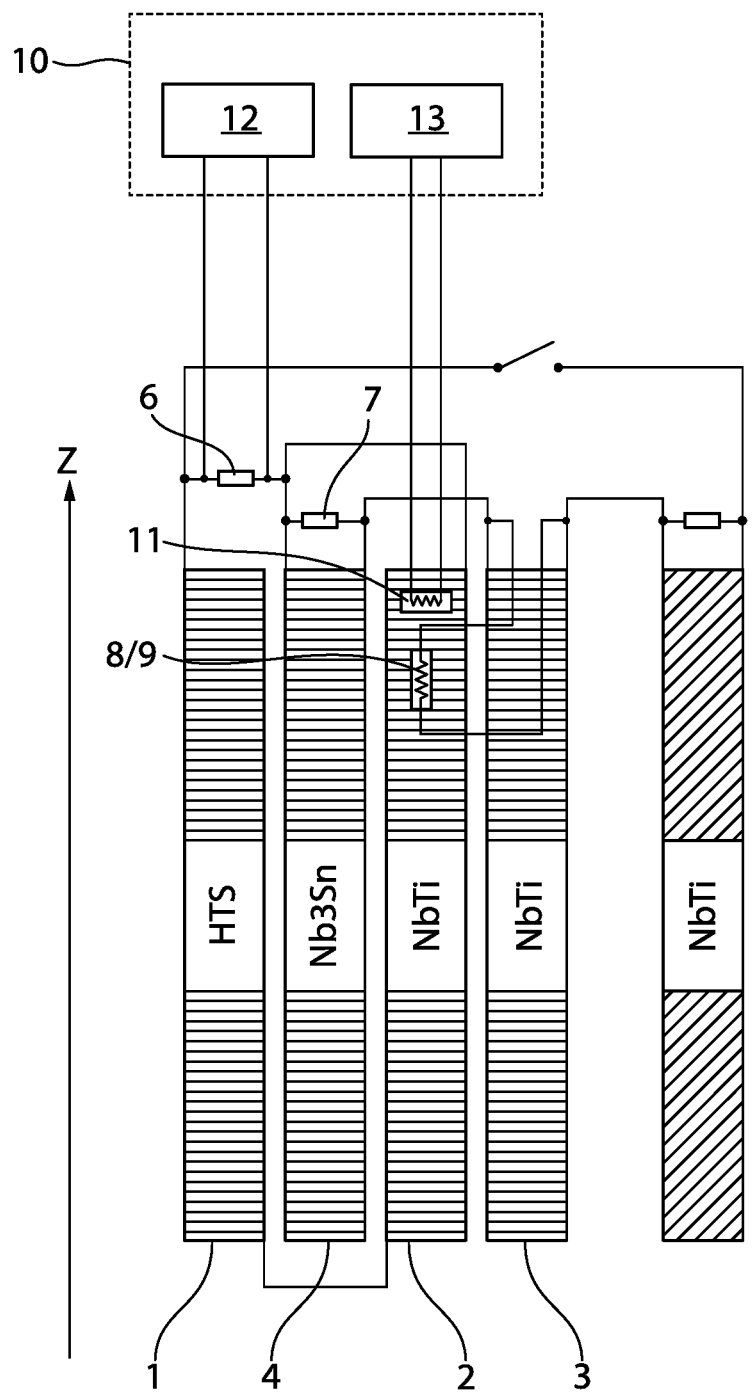
FIG. 3 shows a schematic vertical section of a third example embodiment of a magnet coil system in which an additional heating element is controlled by a heating control device with a quench diagnosis element.

FIG. 3 shows an embodiment in which a heating control device 10 (e.g., an active electronic system) is additionally provided. With this embodiment, if a magnet quench starts in the HTS main coil portion 1, the quench voltage thereof may be used as a trigger for (actively) quenching the second main coil portion 2, by which the current decay in the common first loop is speeded up, so that the low quench propagation rate in the HTS main coil portion does not present any problems. For this purpose, in the event of a quench of the first (HTS) main coil portion 1 the heating control 10 causes a heat input into the second main coil portion 2 via an additional heating element 11. For this purpose, a quench diagnosis element 12 detects the voltage drop over the quench protection element 6 of the HTS main coil portion 1. When a threshold value is exceeded (indicating the occurrence of a quench) a heating control element 13 activates the heating element 11. Thus, in the event of a quench the current drop in the quenching HTS main coil portion 1 is speeded up regardless of the quench propagation in the HTS main coil portion 1 itself. Likewise, in the event of a quench in a main coil portion outside the first protective network loop, the voltage drop on the corresponding quench protection element 7, 8 may be used as a trigger in order to start the quench in the second main coil portion 2 with a heating control device. The quench diagnosis element 12 then monitors the voltage drop over the quench protection element 7, 8 of the corresponding main coil portion 3, 4.

The heating of the second main coil portion 2 may take place with a single heating element or with a plurality of heating elements. A plurality of heating elements may be advantageous if different heating elements are activated by a quench in different main coil portions 1, 3, 4.

Figure 4A:
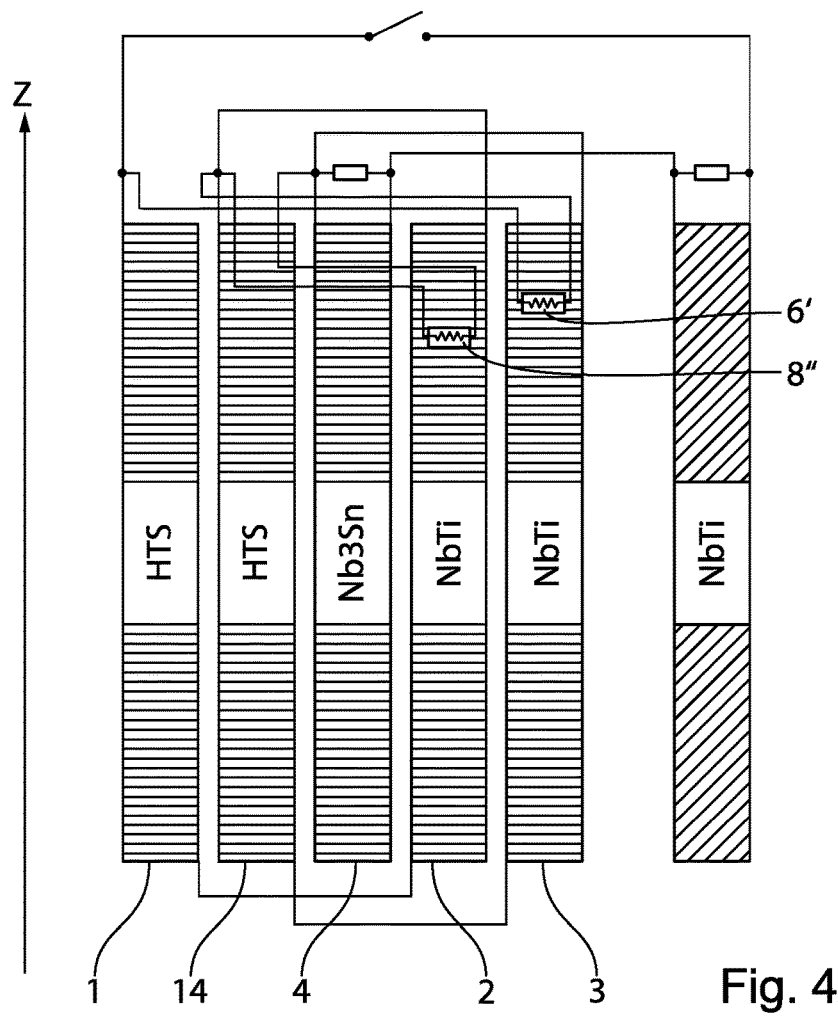
FIG. 4A shows a schematic vertical section of a further example embodiment of a magnet coil system in which a plurality of loops of a protective network with an HTS main coil portion are provided.
Figure 4B:
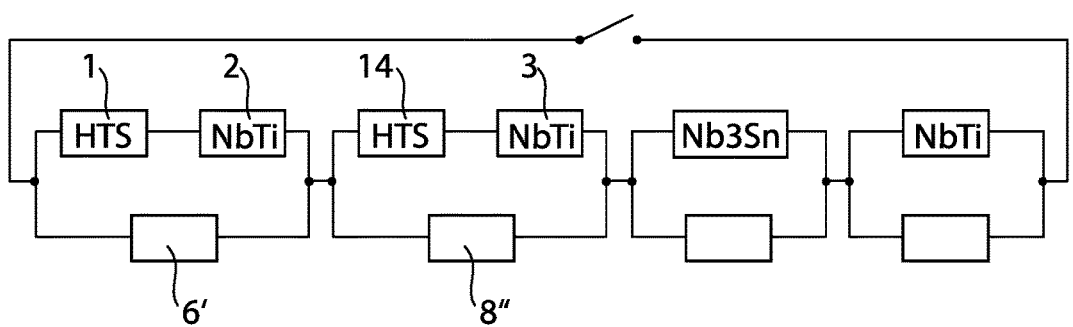
FIG. 4B shows a circuit diagram of the arrangement according to FIG. 4A.

FIGS. 4A, 4B show a further example embodiment of a magnet coil arrangement in which both the first loop and the second loop have an HTS main coil portion 1 or 14. In the first loop the series connection of a first main coil portion 1 (HTS main coil portion) and a second main coil portion 2 (NbTi main coil portion) is bridged by a first quench protection element 6'. In the second loop a series connection of a fourth main coil portion 14 (HTS main coil portion) and the third main coil portion 3 (NbTi main coil portion) is bridged by a second quench protection element 8". Thus, in this example embodiment the HTS zone (i.e., the first main coil portion 1 and the fourth main coil portion 14) is distributed over different loops. In order to prevent an increase in current in the HTS material in both loops, the two quench protection elements 6', 8" are used as respective heating elements for the HTS main coil portions 1, 14. The quench protection elements 6', 8" which serve as heating elements are only in thermal contact with the second or third main coil portion 2, 3, so that in the event of a quench the HTS main coil portions 1, 14 are not heated and thus damage to the HTS main coil portions is avoided. Furthermore, the current in the loops is reduced by heating of the LTS main coil portions 2, 3, before a significant increase in current can occur in the HTS main coil portions.

With the magnet coil system according to the techniques described herein, a quench in the material of the first main coil portion 1 may be prevented (if the quench originates outside the first main coil portion 1) or the decay of the current in the first main coil portion 1 may be speeded up (if the first main coil portion 1 itself should quench).

The techniques described herein are described with reference to an example embodiment in which the first main coil portion contains HTS material and the second main coil portion contains NbTi. However, other material combinations are also possible, so long as the critical temperature of the first main coil portion is greater than that of the second main coil portion.

LIST OF REFERENCES 1 first main coil portion (HTS main coil portion of the first loop)
2 second main coil portion (NbTi main coil portion of the first loop)
3 third main coil portion (NbTi main coil portion of the second loop)
4 further main coil portion ($Nb_3Sn$ main coil portion)
5 main coil
6, 6' first quench protection element
7 further quench protection element
8, 8', 8" second quench protection element
9 first heating element
10 heating control device
11 additional heating element
12 quench diagnosis element
13 heating control element
14 fourth main coil portion (NbTi main coil portion of the second loop)

What is claimed is:

1. A superconducting magnet coil system comprising:
a first electrical loop comprising:
    a first main coil portion with a first conductor which comprises a first superconducting material,
    a second main coil portion with a second conductor which comprises a second superconducting material, and
    a first quench protection element bridging the first main coil portion and the second main coil portion,
wherein the first main coil portion and the second main coil portion are connected to one another in series such that in operation current flows through the first and second main coil portions in a single, same direction, and
a second electrical loop comprising a third main coil portion with a third conductor made of a third a superconducting material and a second quench protection element, and
a first heating element configured to be supplied with a heating voltage for reducing the current in the first electrical loop,
wherein the first superconducting material has a higher critical temperature than does the second superconducting material,
wherein the second electrical loop is connected in series to the first electrical loop, and
wherein the second main coil portion but not the first main coil portion is in thermal contact with the first heating element.

2. The superconducting magnet coil system according to claim 1, wherein the first main coil portion has the highest critical temperature of main coil portions of the system.

3. The superconducting magnet coil system according to claim 1, wherein the first superconducting material comprises a High Temperatures Superconductor (HTS) material.

4. The superconducting magnet coil system according to claim 1, wherein the second superconducting material comprises a Low Temperatures Superconductor (LTS) material.

5. The superconducting magnet coil system according to claim 4, wherein the LTS material comprises one of NbTi or $Nb_3Sn$.

6. The superconducting magnet coil system according to claim 1, wherein the second quench protection element bridges the third main coil portion.

7. The superconducting magnet coil system according to claim 1, wherein the second quench protection element bridges a series connection which comprises the third main coil portion and a fourth main coil portion, wherein the fourth main coil portion comprises a fourth superconducting material, wherein the fourth superconducting material has a higher critical temperature than the third superconducting material.

8. The superconducting magnet coil system according to claim 7, further comprising a second heating element configured to be supplied with a heating voltage for reducing the current in the second electrical loop, wherein the third main coil portion but not the fourth main coil portion is in thermal contact with the second heating element.

9. The superconducting magnet coil system according to claim 1, wherein the second quench protection element serves as the first heating element.

10. The superconducting magnet coil system according to claim 1, wherein the first heating element is connected in parallel to the second quench protection element.

11. The superconducting magnet coil system according to claim 1, wherein the first main coil portion and the second main coil portion directly follow one another radially.

12. The superconducting magnet coil system according to claim 1, further comprising a heating control device,
wherein the heating control device comprises a quench diagnosis element configured to monitor at least one of the first main coil portion or the second main coil portion,
wherein the heating control device is configured, in the event of a quench of the first main coil portion or the second main coil portion, to supply an additional heating element with voltage, wherein the second main coil portion but not the first main coil portion is in thermal contact with the additional heating element.

13. The superconducting magnet coil system according to claim 1, wherein the first main coil portion, the second main coil portion, and the third main coil portion are radially nested in one another.

14. The superconducting magnet coil system according to claim 1, wherein the first main coil portion is an innermost main coil portion of the magnet coil system.

15. The superconducting magnet coil system according to claim 1, wherein the first heating element is arranged inside the second main coil portion at a location at which a maximum capacity of the second superconducting material is available during operation of the magnet coil system.

16. The superconducting magnet coil system according to claim 1, wherein the superconducting magnet coil is configured as a superconducting Nuclear Magnetic Resonance (NMR) magnet coil system.

17. A method for operating a superconducting magnet coil system according to claim 1, wherein, in the event of a quench of a main coil portion of the second electrical loop in the first electrical loop, the second main coil portion, but not the first main coil portion and the third main coil portion, is heated by the first heating element.

* * * * *